United States Patent [19]
Fukunaga

[11] Patent Number: 5,963,066
[45] Date of Patent: Oct. 5, 1999

[54] SEMICONDUCTOR DEVICE WHICH DRIVES LOW-VOLTAGE DRIVEN SWITCHING DEVICE, USING LOW-VOLTAGE DIRECT CURRENT POWER SOURCE, A DIODE AND A CAPACITOR

[75] Inventor: Masanori Fukunaga, Tokyo, Japan

[73] Assignee: Mitsubishi Denki Kabushiki Kaisha, Tokyo, Japan

[21] Appl. No.: 08/922,373

[22] Filed: Sep. 3, 1997

[30] Foreign Application Priority Data

Mar. 31, 1997 [JP] Japan ................................. 9-079756

[51] Int. Cl.$^6$ ....................................................... H03B 1/00
[52] U.S. Cl. ........................... 327/112; 327/482; 323/224; 323/289
[58] Field of Search ...................... 327/108, 111, 327/112, 482, 390, 589; 323/229, 230, 231, 289, 224, 225

[56] References Cited

U.S. PATENT DOCUMENTS

| | | | |
|---|---|---|---|
| 5,325,258 | 6/1994 | Choi et al. ................................ | 361/87 |
| 5,412,309 | 5/1995 | Ueunten ................................... | 323/316 |
| 5,796,276 | 8/1998 | Phillips et al. ........................... | 327/108 |
| 5,818,209 | 10/1998 | Masini et al. ............................ | 323/289 |

*Primary Examiner*—Timothy P. Callahan
*Assistant Examiner*—Jung Ho Kim
*Attorney, Agent, or Firm*—Oblon, Spivak, McClelland, Maier & Neustadt, P.C.

[57] ABSTRACT

A capacitor (C) and a Zener diode (ZD2) are connected in parallel to a high-voltage side drive circuit (2). when a Zener voltage (VZD2) is set 5V, a voltage which is charged up in the capacitor (C) is determined by the Zener voltage (VZD2). Hence, it is only necessary to set a voltage (VCC) in a loxv-voltage d.c. power source (4) at a value which is higher than (VZD2+VD+VCE), where VD is a forward-direction voltage to a diode (Di) and VCE is an ON-voltage to a low-voltage side switching device (Q1). Since a variation in a charging voltage which is supplied to a high-voltage side drive circuit is suppressed, it is possible to drive a switching device with 5V.

20 Claims, 6 Drawing Sheets

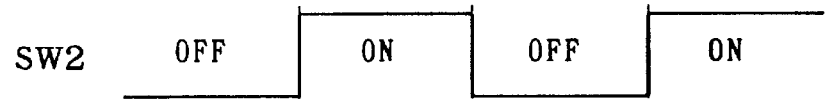
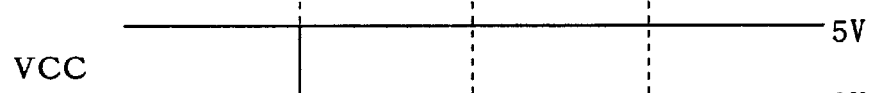
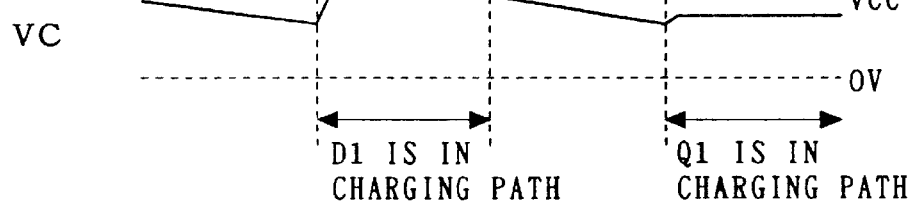

Q1

Q2

SW1

SW2

VCC

VC1

VC

SEMICONDUCTOR DEVICE WHICH DRIVES LOW-VOLTAGE DRIVEN SWITCHING DEVICE, USING LOW-VOLTAGE DIRECT CURRENT POWER SOURCE, A DIODE AND A CAPACITOR

BACKGROUND OF THE INVENTION

1. Field of the Invention

The present invention relates to a technique for driving a power device of a semiconductor device, and more particularly, to a single power source drive circuit for a power device of a half-bridge structure.

2. Description of the Background Art

A single power source drive circuit for a power device of a half-bridge structure, as shown in FIG. 10, comprises two switching devices Q2P and Q1P which are connected in series between a high-voltage d.c. power source 1P and a ground GND, and a high-voltage side drive circuit (i.e., gate driver) 2P and a low-voltage side drive circuit (i.e., gate driver) 3P which respectively drive the switching devices Q2P and Q1P. The drive circuits 2P and 3P turn on and off the two switching devices Q2P and Q1P alternately.

In the conventional drive circuit for a power device, a low-voltage d.c. power source 4P whose one end is connected to the ground GND supplies a voltage VCC to the low-voltage side drive circuit 3P, and charges a capacitor CP through a diode DiP. A voltage from the capacitor CP is supplied to the high-voltage side drive circuit 2P. Normally, diodes D2P and D1P are connected in inverse parallel connection to the switching devices Q2P and Q1P which are connected in series between the high-voltage d.c. power source 1P and the ground GND. The diodes D2P and D1P are used for regeneration of induced electromotive force when an inductance L is loaded.

The operation principles of the conventional drive circuit which is shown in FIG. 10 are as follows. That is, (A) when the switching device Q1P is ON, the capacitor CP is charged up on a path L1 from the low-voltage d.c. power source 4P in which the diode DiP, the capacitor CP and the switching device Q1P are disposed or on a path L2 from the low-voltage d.c. power source 4P in which the diode DiP, the capacitor CP and the diode D1P are disposed, and (B) when the switching device Q2P is ON, since the diode DiP is reverse-biased, the capacitor CP floats, and therefore, the voltage which is charged up the capacitor CP is supplied to the switching device Q2P.

However, in the conventional drive circuit which is shown in FIG. 10, since the low-voltage side switching device Q1P and the low-voltage side diode D1P are in the charging paths L1 and L2, respectively, on which the capacitor CP is charged up, a charging voltage VC to the capacitor CP is within the following range:

$$VC = (VCC - VD - VCE) \text{ to } (VCC - VD + VF)$$

where an ON-voltage to the low-voltage side switching device Q1P is VCE, a forward-direction voltage to the diode D1P is VF, a forward-direction voltage to the diode DiP is VD, and a voltage in the low-voltage d.c. power source 4P is vCC.

Thus, while the inductance L is loaded, there are a period in which the switching device Q1P is ON so that the switching device Q1P carries a current (path L1) and a period in which the diode D1P carries a current (path L2). Normally, the ON-voltage VCE for the low-voltage side switching device Q1P is around 2V, and so is the forward-direction voltage VF to the diode D1P. Hence, where the forward-direction voltage VD to the diode DiP is about 1V, the charging voltage VC to the capacitor CP varies in the following range:

$$VC = (VCC - 3V) \text{ to } (VCC + 1V)$$

In other words, when a current flows in the path L1 so that the capacitor CP is charged up, the charging voltage VC is 3V lower than the voltage VCC of the low-voltage d.c. power source.

In such a case, the range of the charging voltage VC is from 12V to 16V in a 15V-driven switching device (in which VCC=15V). During driving with 15V, a gate voltage in the high-voltage side switching device Q2P in the ON-state is a minimum of 3V. This level of variation in charging voltage VC is said to fall within a usable voltage range.

However, in a 5V-driven switching device (in which VCC=5V), the charging voltage VC ranges from 2V to 6V. The variation in charging voltage VC is too great to use this circuit. That is, during driving with 5V, the gate voltage in the high-voltage side switching device Q2P in the ON-state is 0.5V to 0.75V, and hence, as the charging voltage VC drops as much as 3V from the drive voltage of 5V, even though the switching device Q1P turns on, an ON-resistance becomes large so that a big loss is created at the switching device Q2P. Even worse than this, there is a possibility that even driving of the switching device Q2P will become uncontrollable.

Thus, there is an inherent problem in the conventional single power source drive circuit for a power device of a half-bridge structure that the charging voltage largely changes due to the low-voltage side switching device which is created in the charging path for charging the capacitor which supplies a voltage to the drive circuit of the high-voltage side switching device or due to the diode which is connected to the low-voltage side switching device in inverse parallel connection. Hence, the conventional circuit can not drive a 5V-driven switching device with a low-voltage d.c. power source voltage of 5V. Such a problem must be overcome considering the recent trend that a voltage for driving devices have become lower and lower.

SUMMARY OF THE INVENTION

A first aspect of the present invention is directed to a semiconductor device which comprises: a high-voltage direct current power source; a high-voltage side switching device whose first electrode is connected to the high-voltage direct current power source; a high-voltage side drive circuit whose first terminal and second terminal are respectively connected to a control electrode and a second electrode of the high-voltage side switching device; a low-voltage side switching device whose first electrode is connected to the second electrode of the high-voltage side switching device, a second electrode of the low-voltage side switching device being connected to a ground; and a low-voltage side drive circuit whose first terminal and second terminal are respectively connected to a control electrode and the second electrode of the low-voltage side switching device, wherein the high-voltage side switching device and the low-voltage side switching device are controlled by the high-voltage side drive circuit and the low-voltage side drive circuit to alternatively turn on and off. The semiconductor device further comprises: a diode; a low-voltage direct current power source whose one end and other end are respectively connected to an anode of the diode and the ground; a capacitor whose first electrode is connected to the one end of the low-voltage direct current power source through the diode and also to a third terminal of the high-voltage side drive circuit, a second electrode of the capacitor being connected to the second electrode of the high-voltage side switching device; and a voltage fixing circuit connected in parallel to the capacitor for fixing a voltage value between the both ends of the capacitor during charging of the capacitor which occurs while the high-voltage side switching device operates in an on-state.

According to a second aspect of the present invention, the semiconductor device of the first aspect further comprises: a low-voltage side diode whose cathode and anode are respectively connected to the first electrode and the second electrode of the low-voltage side switching device; and a resistor whose one end and other end are respectively connected to a cathode of the diode and the first electrode of the capacitor, wherein the voltage fixing circuit comprises a Zener diode whose cathode is connected to the first electrode of the capacitor and whose anode is connected to the second electrode of the capacitor, and a voltage in the low-voltage direct current power source is set at a larger value than a sum of a Zener voltage of the Zener diode, a forward-direction voltage to the diode and an ON-voltage to the low-voltage side switching device.

In a third aspect of the present invention, the semiconductor device of the second aspect further comprises: another Zener diode whose cathode and anode are respectively connected to a third terminal of the low-voltage side drive circuit and the ground; and another resistor which is connected between the one end of the low-voltage direct current power source and the cathode of the another Zener diode.

A semiconductor device according to a fourth aspect of the present invention comprises: a high-voltage side switching device whose first electrode is connected to a high-voltage direct current power source; a high-voltage side drive circuit whose first terminal and second terminal are respectively connected to a control electrode and a second electrode of the high-voltage side switching device; a low-voltage side switching device whose first electrode is connected to the second electrode of the high-voltage side switching device, a second electrode of the low-voltage side switching device being connected to a ground; and a low-voltage side drive circuit whose first terminal and second terminal are respectively connected to a control electrode and the second electrode of the low-voltage side switching device, wherein the high-voltage side switching device and the low-voltage side switching device are controlled by the high-voltage side drive circuit and the low-voltage side drive circuit to alternatively turn on and off. The semiconductor device further comprises: a low-voltage side diode whose cathode and anode are respectively connected to the first electrode and the second electrode of the low-voltage side switching device; a diode; a low-voltage direct current power source whose one end and other end are respectively connected to an anode of the diode and the ground; and a charging voltage supplying circuit which is connected to a cathode of the diode, the ground and a third terminal of the high-voltage side drive circuit, the charging voltage supplying circuit storing a charge which is supplied from the low-voltage direct current power source but not through the low-voltage side switching device nor the low-voltage side diode and which is needed to drive the high-voltage side switching device when the low-voltage side switching device operates in an on-state, the charging voltage supplying circuit supplying a charging voltage which is in accordance with the charge to the high-voltage side drive circuit when the high-voltage side switching device operates in an on-state.

According to a fifth aspect of the present invention, in the semiconductor device of the fourth aspect, when the diode is regarded as a first diode, and the charging voltage supplying circuit comprises: a first capacitor whose first electrode is connected to the cathode of the first diode; a first switch which is disposed between a second electrode of the first capacitor and the ground, the first switch being controlled to turn on when the low-voltage side switching device operates in an on-state, the first switch being controlled to turn off when the high-voltage side switching device operates in an on-state; a second diode whose anode and cathode are respectively connected to the cathode of the first diode and the third terminal of the high-voltage side drive circuit; a second capacitor whose first and second electrodes are respectively connected to the third and the second terminals of the high-voltage side drive circuit; and a second switch which is disposed between the second electrode of the first capacitor and the second electrode of the second capacitor, the second switch being controlled to turn off when the low-voltage side switching device operates in an on-state, the second switch being controlled to turn on when the high-voltage side switching device operates in an on-state.

According to a sixth aspect of the present invention, in the semiconductor device of the fourth aspect, the charging voltage supplying circuit comprises: a first capacitor whose first electrode is connected to the cathode of the diode; a first switch which is disposed between a second electrode of the first capacitor and the ground, the first switch being controlled to turn on when the low-voltage side switching device operates in an on-state, the first switch being controlled to turn off when the high-voltage side switching device operates in an on-state; a second capacitor whose first and second electrodes are respectively connected to the third and the second terminals of the high-voltage side drive circuit; a second switch which is disposed between the second electrode of the first capacitor and the second electrode of the second capacitor, the second switch being controlled to turn off when the low-voltage side switching device operates in an on-state, the second switch being controlled to turn on when the high-voltage side switching device operates in an on-state; and a third switch which is disposed between the first electrode of the first capacitor and the first electrode of the second capacitor, the third switch being controlled to turn off when the low-voltage side switching device operates in an on-state, the third switch being controlled to turn on when the high-voltage side switching device operates in an on-state.

According to a seventh aspect of the present invention, the semiconductor device of the fifth aspect further comprises: another Zener diode whose cathode and anode are respectively connected to a third terminal of the low-voltage side drive circuit and the ground; and another resistor which is connected between the one end of the low-voltage direct current power source and the cathode of the another Zener diode.

Alternatively, according to an eighth aspect of the present invention, the semiconductor device of the fifth aspect further comprises: a third diode which is connected between a third terminal of the low-voltage side drive circuit and the one end of the low-voltage direct current power source.

Alternatively, according to a ninth aspect of the present invention, in the semiconductor device of the fifth aspect, a third terminal of the low-voltage side drive circuit is connected directly to the one end of the low-voltage direct current power source.

According to a tenth aspect of the present invention, the semiconductor device of the sixth aspect further comprises: another Zener diode whose cathode and anode are respectively connected to a third terminal of the low-voltage side drive circuit and the ground; and another resistor which is connected between the one end of the low-voltage direct current power source and the cathode of the another Zener diode.

Alternatively, according to an eleventh aspect of the present invention, the semiconductor device of the sixth aspect further comprises: a third diode which is connected between a third terminal of the low-voltage side drive circuit and the one end of the low-voltage direct current power source.

Alternatively, according to a twelfth aspect of the present invention, in the semiconductor device of the sixth aspect, a third terminal of the low-voltage side drive circuit is connected directly to the one end of the low-voltage direct current power source.

Alternatively, according to a thirteenth aspect of the present invention, in the semiconductor device of the fifth aspect, a voltage in the low-voltage direct current power source is set at a value which is obtained by adding a forward-direction voltage to the first diode to a drive voltage to the high-voltage side switching device.

Alternatively, according to a fourteenth aspect of the present invention, in the semiconductor device of the sixth aspect, a voltage in the low-voltage direct current power source is set at a value which is obtained by adding a forward-direction voltage to the first diode to a drive voltage to the high-voltage side switching device.

A semiconductor device according to a fifteenth aspect of the present invention comprises: a high-voltage side switching device whose first electrode is connected to a high-voltage direct current power source; a high-voltage side drive circuit whose first terminal and second terminal are respectively connected to a control electrode and a second electrode of the high-voltage side switching device; a low-voltage side switching device whose first electrode is connected to the second electrode of the high-voltage side switching device, a second electrode of the low-voltage side switching device being connected to a ground; and a low-voltage side drive circuit whose first terminal and second terminal are respectively connected to a control electrode and the second electrode of the low-voltage side switching device, wherein the high-voltage side switching device and the low-voltage side switching device are controlled by the high-voltage side drive circuit and the low-voltage side drive circuit to alternatively turn on and off. The semiconductor device further comprises: a low-voltage side diode whose cathode and anode are respectively connected to the first electrode and the second electrode of the low-voltage side switching device; a diode; a low-voltage direct current power source whose one end and other end are respectively connected to an anode of the diode and the ground; and a charging voltage supplying circuit which is connected to a cathode of the diode, the ground and a third terminal of the high-voltage side drive circuit, the charging voltage supplying circuit storing a charge which is supplied from the low-voltage direct current power source but not through the low-voltage side switching device nor the low-voltage side diode and which is needed to drive the high-voltage side switching device when the high-voltage side switching device operates in an on-state, the charging voltage supplying circuit supplying a charging voltage which is in accordance with the charge to the high-voltage side drive circuit when the low-voltage side switching device operates in an on-state.

According to a sixteenth aspect of the present invention, in the semiconductor device of the fifteenth aspect, when the diode is regarded as a first diode, and the charging voltage supplying means comprises: a first capacitor whose first electrode is connected to the cathode of the first diode; a first switch which is disposed between a second electrode of the first capacitor and the ground, the first switch being controlled to turn on when the high-voltage side switching device operates in an on-state, the first switch being controlled to turn off when the low-voltage side switching device operates in an on-state; a second diode whose anode and cathode are respectively connected to the cathode of the first diode and the third terminal of the high-voltage side drive circuit; a second capacitor whose first and second electrodes are respectively connected to the third and the second terminals of the high-voltage side drive circuit; and a second switch which is disposed between the second electrode of the first capacitor and the second electrode of the second capacitor, the second switch being controlled to turn off when the high-voltage side switching device operates in an on-state, the second switch being controlled to turn on when the low-voltage side switching device operates in an on-state.

According to a seventeenth aspect of the present invention, in the semiconductor device of the sixteenth aspect, a voltage in the low-voltage direct current power source is set at a value which is obtained by adding a forward-direction voltage to the first diode to a drive voltage to the high-voltage side switching device.

Alternatively, according to an eighteenth aspect of the present invention, the semiconductor device of the sixteenth aspect further comprises: another Zener diode whose cathode and anode are respectively connected to a third terminal of the low-voltage side drive circuit and the ground; and another resistor which is connected between the one end of the low-voltage direct current power source and the cathode of the another Zener diode.

Alternatively, according to a nineteenth aspect of the present invention, the semiconductor device of the sixteenth aspect further comprises: a third diode which is connected between a third terminal of the low-voltage side drive circuit and the one end of the low-voltage direct current power source.

According to the invention defined in the first to the second aspects, even if the low-voltage side switching device exists in the charging path to the capacitor, it is always possible to fix the voltage across the capacitor at a constant value during charging without any influence of the charging path. Hence, the present invention is applicable without any problem to a case where the low-voltage side switching device of the invention is to be driven using the low-voltage d.c. power source, e.g., where a 5V-driven switching device is to be driven using the low-voltage d.c. power source of 5V.

According to the invention defined in the second aspect, in particular, even if the low-voltage side diode exists in the charging path to the capacitor, advantageously, it is possible to compensate for the voltage which is created at the low-voltage side diode with the voltage drop which is created at the resistor. Of course, it is always possible to fix the charging voltage to the capacitor constant even during charging up of the capacitor by means of the charging path which comprises the low-voltage side diode.

According to the invention defined in the fourth to the nineteenth aspects, since it is possible to charge up a charge which is necessary to drive the high-voltage side switching device without any influence of the low-voltage side switching device nor the low-voltage side diode, it is possible to suppress a variation in the charging voltage to the high-voltage side drive circuit far smaller than heretofore possible. Hence, the present invention is applicable to even a case where a 5V-driven switching device is to be driven using the low-voltage d.c. of 5V.

According to the invention defined in the fifth, the sixth and the sixteenth aspects, in particular, by means of combination of ON- and OFF-operations of the plurality of switches, it is possible to realize stable charging of the first capacitor, and hence, charging of the second capacitor without disturbed by the low-voltage side switching device or the low-voltage side diode. In addition, since the respective switches can be realized with MOSFETs, for instance. in which case further integration of the respective portions on the charging paths within the device is possible.

According to the invention defined in the thirteenth, the fourteenth and the seventeenth aspects, in particular, (1) in relation to the fifth and the sixteenth aspects, it is possible to confine a variation in the charging voltage to the second capacitor and the supply voltage to the high-voltage side drive circuit within the range of ±1V, (2) in relation to the sixth aspect, it is possible to eliminate a variation in the charging voltage, and (3) it is possible to use the low-voltage d.c. power source of 6V or 5V to thereby drive the high-voltage side switching device with 5V.

Accordingly, an object of the present invention is to provide for a technique on a drive device of a semiconductor device by which a charging voltage to a capacitor does not change even if there is a low-voltage side switching device or a diode which is inverse-parallel connected to the same in a charging path for the capacitor.

Further, the present invention aims at providing for a technique on a drive device of a semiconductor device by which a circuit structure is realized in which there is not a low-voltage side switching device or a diode which is inverse-parallel connected to the same in an actual charging path for a capacitor so that it is possible to use a 5V-driven switching device with a low-voltage d.c. power source voltage of 5V without changing a charging voltage to the capacitor.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 3(*a*) to 3(*g*) are diagrams showing charging timing and driving timing in a method (A);

DESCRIPTION OF THE PREFERRED EMBODIMENTS

The present invention involves roughly two basic technical concepts to be described below.

(I) First, the voltage intended to charge a capacitor is determined by the Zener voltage of a Zener diode, and a low-voltage d.c. power source is used which has a voltage higher than the charging voltage for the capacitor by at least the amount of variations caused by the influence of a low-voltage side switching device included in a charging path of the capacitor or a diode inverse-parallel connected to the low-voltage side switching device.

(II) Secondary, another switching portion is provided to prevent the low-voltage side switching device or the diode inverse-parallel connected to the low-voltage side switching device from being included in the charging path of the capacitor, and is switched on/off when the low-voltage side switching device and a high-voltage side switching device turn on to charge the capacitor. The use of this structure provides a much smaller variation in capacitor charging voltage than the conventional structure, which will be described later.

A first preferred embodiment of the present invention to be described below is based on the structure (I), and second and third preferred embodiments are based on the structure (II).

<First Preferred Embodiment>

In the following, a first preferred embodiment of the present invention will be described in detail with reference to a drawing.

Figure 1:
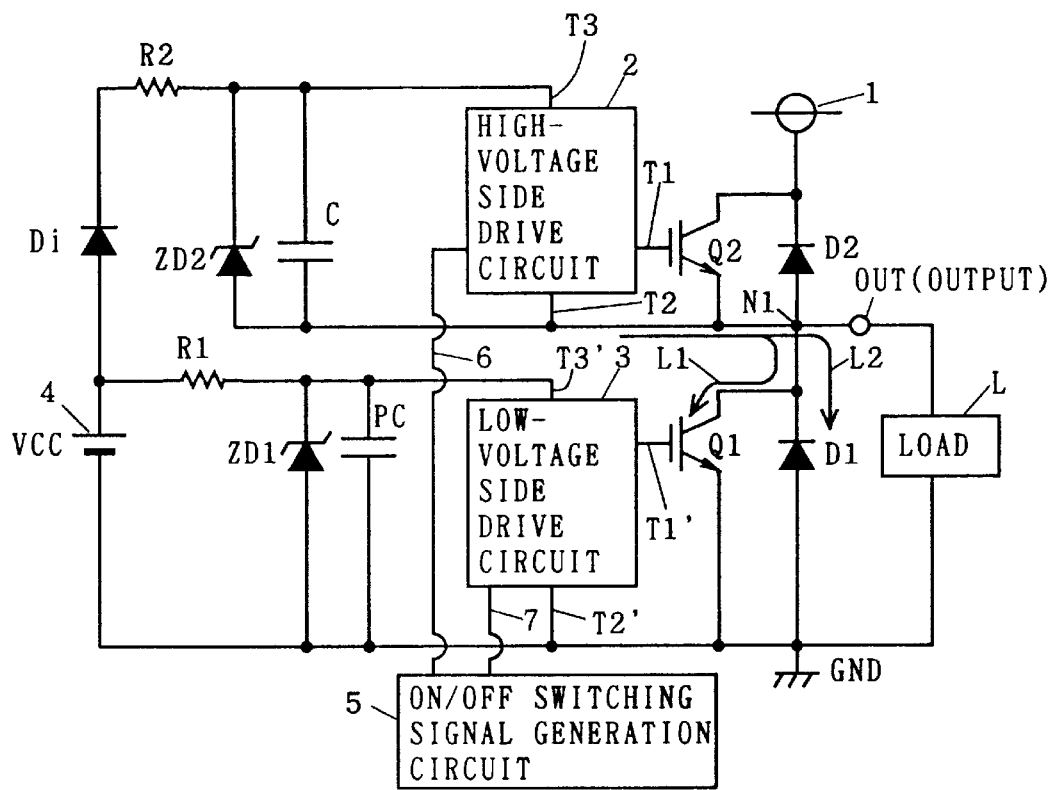
FIG. 1 is a diagram showing a single power source drive circuit for a power device of a half-bridge structure according to a first preferred embodiment of the present invention.

FIG. 1 is a diagram showing a semiconductor device according to the first preferred embodiment. This device is related to a single power source drive circuit for a power device of a half-bridge structure.

This device comprises two switching devices Q2 and Q1 which are connected in this order in series between a high-voltage d.c. power source 1 and a ground GND, diodes D1 and D2 which are respectively connected in inverse parallel connection to the two switching devices Q2 and Q1, and gate drivers which respectively drive the two switching devices Q2 and Q1, namely, a high-voltage side drive circuit 2 and a low-voltage side drive circuit 3.

The drive circuits 2 and 3 are gate drivers of a known structure comprising transistors. Denoted at T1, T2 and T3 are a first, a second and a third terminals of the drive circuit 2, and denoted at T1', T2' and T3' are a first, a second and a third terminals of the drive circuit 3. The first ends T1 and T1' are output terminals. An input voltage which is necessary for the circuit 2 (3) to operate is applied between the second terminal T2 (T2') and the third terminal T3 (T3').

Of these, the switching devices Q2 and Q1 will be respectively referred to as "high-voltage side switching device" or "second switching device" and "low-voltage side switching device" or "first switching device" as well, and the diodes D2 and D1 will he respectively referred to as "high-voltage side diode" and "low-voltage side diode" as well. Of the terminals of the devices Q2 and D2, those which are connected to the high-voltage d.c. (direct current) power source 1 are defined as "first electrode" and "second electrode (cathode)," and the other terminals of the devices Q2 and D2, i.e., the terminals of reference potential node N1 (output terminal OUT) side of the device Q2 are defined as "second electrode" and "first electrode (anode)." The terminal of the device Q2 which is connected to the first terminal of the high-voltage side drive circuit 2 is defined as "control electrode." As hereinafter termed, the reference potential node N1 will be referred to simply as "node N1."

With respect to the devices Q1 and D1 as well, in a similar manner, the terminals which are connected to the node N1 are defined as "first electrode" and "second electrode (cathode)," and the other terminals which are connected to the ground GND are defined as "second electrode" and "first electrode (anode)." The switching devices Q2 and Q1 are both formed by transistors such as IGBTs and power MOS transistors.

The symbol PC denotes a bypass capacitor.

With respect to operations of the two switching devices Q2 and Q1, in response to ON/OFF switching signals 6 and 7 (The signal 7 has a reverse phase to the signal 6.) which are generated and outputted by an ON/OFF switching signal generation circuit 5 which is disposed externally, the switching devices Q2 and Q1 are alternatively turned on and off From a low-voltage d.c. power source 4 whose one end is connected to the ground GND (A voltage value of the low-voltage d.c. power source 4 is VCC) through a first resistor R1, a current is supplied to a first Zener diode (or a low-voltage side Zener diode) ZD1 whose first electrode (anode) is connected to the ground GND. The low-voltage side drive circuit 3 is provided with a voltage which is created as a result of this between a second electrode (cathode) and the first electrode of the first Zener diode ZD1.

Meanwhile, from the low-voltage d.c. power source 4 through a diode Di and a second resistor R2, a current is supplied to a second Zener diode (or a high-voltage side Zener diode) ZD2 whose first electrode (anode) is connected to the node N1 of a reference potential (output) of the high-voltage side switching device Q2. A resultant voltage which is created between a second electrode (cathode) and the first electrode of the second Zener diode ZD2 is supplied to the high-voltage side drive circuit 2 through a capacitor C which is connected in parallel to the second Zener diode ZD2. The terminal of the high-voltage side drive circuit 2 which is connected to a first end (or first electrode) of the capacitor C is defined as "third terminal" while the terminal of the high-voltage side drive circuit 2 which is connected to a second end (or second electrode) of the capacitor C is defined as "second terminal."

As the first and the second Zener diodes ZD1 and ZD2, diodes having a Zener voltage of about 5V are used.

Next, operations of this device to drive a power device will be described.

(A) Where the low-voltage side switching device Q1 is ON:

From the low-voltage d.c. power source 4 through the diode Di and the second resistor R2, on a charging path (L1 or L2) in which the capacitor C and the low-voltage side switching device Q1 or the low-voltage diode D1 are disposed, the capacitor C is charged up with a charge which is determined by the voltage which is created between the two electrodes of the second Zener diode ZD2 (i.e., Zener voltage). This ensures that the charging voltage to the capacitor C is constant.

(B) Where the high-voltage side switching device Q2 is ON:

The diode Di is reverse-biased, and therefore, the capacitor C becomes floating, so that a voltage which is charged up in the capacitor C is supplied to the third terminal of the high-voltage side drive circuit 2.

Now, if the voltage VCC is set to satisfy:

$$VCC > VZD2 + VD + VCE \qquad (1)$$

where VCE is an ON-voltage to the low-voltage side switching device Q1, VF is a forward-direction voltage to the diode D1, VD is a forward-direction voltage to the diode Di, VZD2 is the Zener voltage in the second Zener diode ZD2, and VCC is the voltage in the low-voltage d.c. power source, the charging voltage VC to the capacitor C can be always set to obey VC=VZD2. After the capacitor C is charged up, since the second resistor R2 does not carry a current, it is possible to treat a voltage at the second resistor R2 as 0V when a breaking point for setting the voltage VCC is considered. The second resistor R2 itself is a part which compensates for a voltage which results when a current flows in the low-voltage diode D1.

On the other hand since the voltage VCC of the low-voltage d.c. power source 4 is set at a higher value than a regular drive voltage (5V) for a power device, the voltage to the low-voltage side drive circuit 3 is supplied from the low-voltage d.c. power source 4 through the first resistor R1 on a path which reaches to the first Zener diode ZD1. The voltage which is supplied in this manner is a Zener voltage VZD1 of the first Zener diode ZD1. Hence, VZD1=VZD2 holds. In short, the value of the first resistor R1 is set in such a manner that the supplied voltage described above is equal to the Zener voltage VZD1 (=VZD2).

In the manner described above, it is possible to ensure that a variation in the charging voltage to the capacitor C as the drive power source of the high-voltage side is 0V, and hence, to stably drive a 5V-driven switching device.

The second Zener diode ZD2 can be said as a circuit for fixing a voltage between the two ends of the capacitor C while the capacitor C is charged up by turning on the low-voltage side switching device Q1.

It then follows that the second Zener diode ZD2 shown in FIG. 1 can be said as a voltage fixing portion for fixing a voltage value between the two ends of the capacitor C during charging up of the capacitor C which occurs when the high-voltage side switching device Q2 is ON.

<Second Preferred Embodiment>

Figure 2:
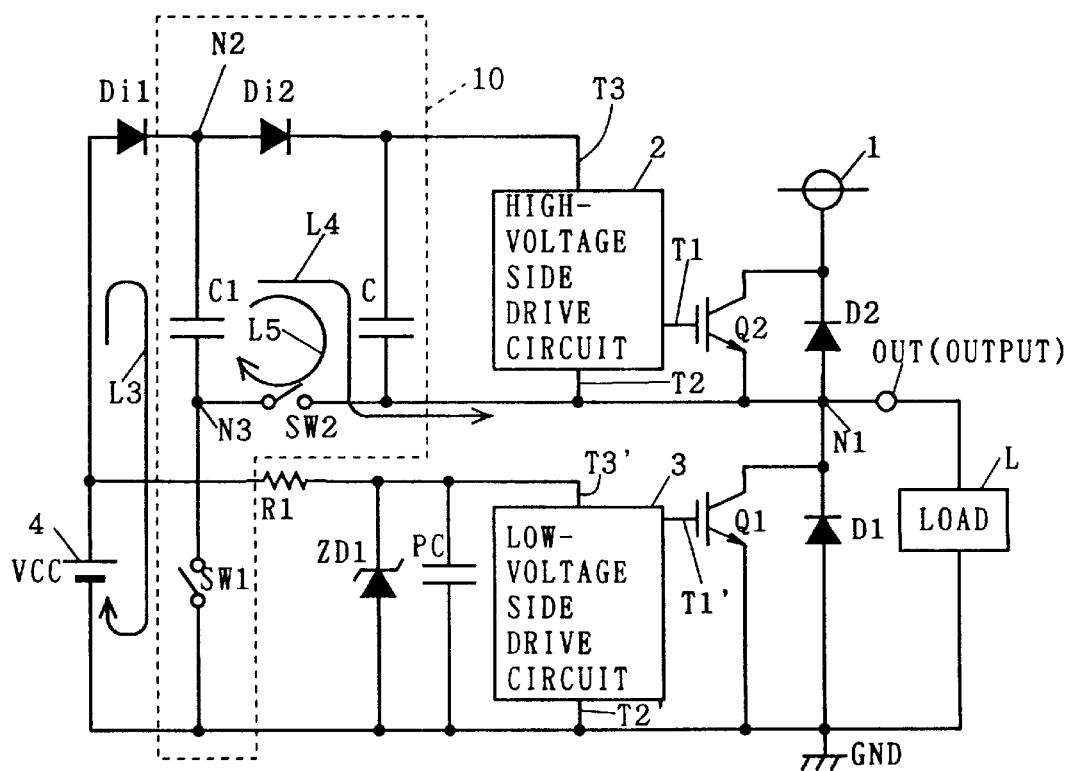
FIG. 2 is a diagram showing a single power source drive circuit for a power device of a half-bridge structure according to a second preferred embodiment of the present invention.
Figure 4:
FIGS. 4(*a*) to 4(*g*) are diagrams showing charging timing and driving timing in a method (B)
Figure 4:
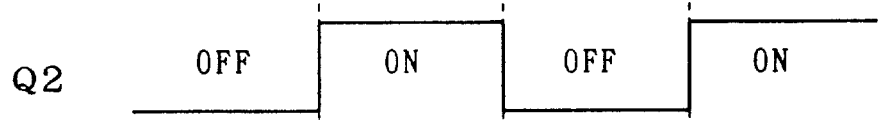
Figure 4:
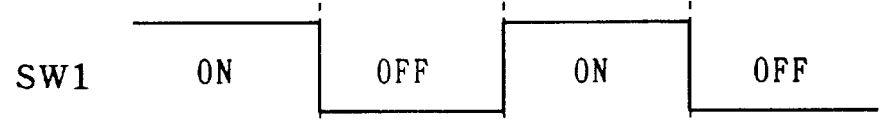
Figure 4:
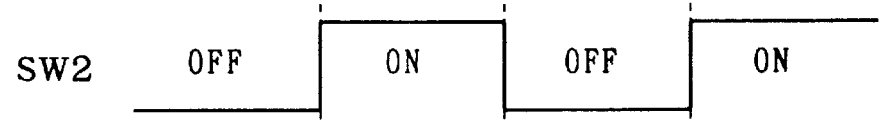
Figure 4:
Figure 4:
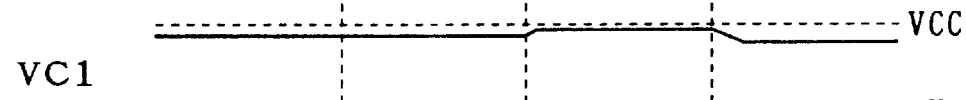
Figure 4:
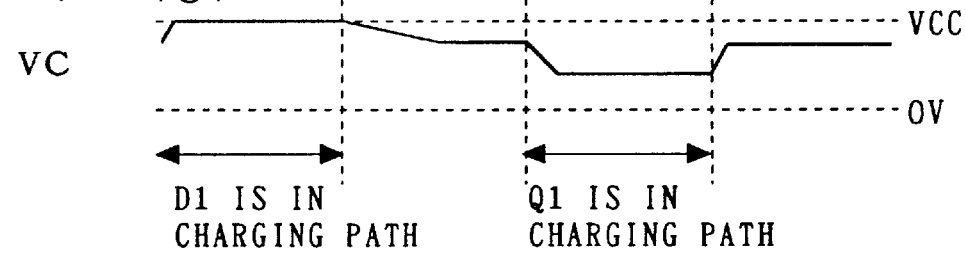

FIG. 2 is a diagram showing a semiconductor device according to a second preferred embodiment of the present invention.

The device shown in FIG. 2 is different from the device shown in FIG. 1 in that instead of the second Zener diode ZD2 and the second resistor R2, a first capacitor C1, a first and a second diodes Di1 and Di2, and a first and a second switches SW1 and SW2 are disposed. Other structures remain the same. More precisely, a first end (or first electrode) of the first capacitor C1 is connected to a connection node between a cathode of the first diode Di1 and an anode of the second diode Di2, a first end of the second switch SW2 is connected to a connection node N3 between the second end (or second electrode) of the first capacitor C1 and a first end of the first switch SW1, second ends of the first and the second switches SW1 and SW2 are connected to the ground GND and the node N1, respectively. In the second preferred embodiment, the capacitor C is defined as a second capacitor C.

FIG. 2 omits showing the external ON/OFF switching signal generation circuit which is shown in FIG. 1. The drawings related to other preferred embodiment which will be described later will also omit the circuit 5.

The voltage which is applied on the first Zener diode ZD1 from the low-voltage d.c. power source 4 (whose voltage is VCC) through the first resistor R1, namely, the Zener voltage VZD1 (=5V) is supplied to the low-voltage side drive circuit 3.

On the other hand, the first switch SW1 is turned on and the second switch SW2 is turned off, so that the first capacitor C1 is charged up from the low-voltage d.c. power source 4 through the first diode Di1 on a charging path L3 which is formed by the first capacitor C1 and the first switch SW1. Following this, the second switch SW2 is turned on and the first switch SW1 is turned off, so that the second capacitor C is charged up from the first capacitor C1 through the second diode Di2 and the charging voltage to the second capacitor C is supplied to the high-voltage side drive circuit 2.

Now, operations will be described. As there are two methods as a method of driving the circuit which is shown in FIG. 2, the two methods will be described as the methods (A) and (B) in this order.

<First Method A>

Forward-direction voltages to the first diode Di1 and the second diode Di2 will be both denoted as VD, and ON-voltages to the first switch SW1 and the second switch SW2 are both 0V.

(a) Where the high-voltage side switching device Q2 is ON:

The first switch SW1 is turned on and the second switch SW2 is turned off under control. At this stage, from the low-voltage d.c. power source 4, on the charging path L3 which is formed by the elements Di1, C1 and SW1, the first capacitor C1 is charged up. The charging voltage VC1 is expressed as:

$$VC1 = VCC - VD$$

Since the second switch SW2 is OFF, the low-voltage side switching device Q1 and the low-voltage side diode D1 are not in the charging path L3. This prevents the charging voltage VC1 from varying which occurs in the conventional technique.

At this time, the voltage VC which has been already charged up in the second capacitor C as a result of the operation (b) which precedes the operation (a) operates the high-voltage side drive circuit 2. Now, since the high-voltage side switching device Q2 is ON, the potential of an output from the high-voltage side switching device Q2 is high, whereby the second capacitor C floats.

(b) Where the low-voltage side switching device Q1 is ON subsequently:

The first switch SW1 is turned off and the second switch SW2 is turned on under control. Charging paths which result at this stage are: (1) a first path L4 which is formed by the low-voltage side switching device Q1 or the low-voltage side diode D1 through the elements Di1, Di2 and C and which extends from the low-voltage d.c. power source 4; and (2) a second path L5 which reaches the second switch SW2 from the first capacitor C1 through the elements Di2 and C. Where VCE=VF=2V and VD=1V, the charging voltages VC on the respective paths L4 and L5 are expressed as follows.

First, on the first path L4, $$VC = (VCC - 2 \times VD - VCE) \text{ to } (VCC - 2 \times VD + VE) = (VCC - 4V) \text{ to } VCC$$

On the other hand, on the second path L5, $$VC = VC1 - VD = VCC - 2 \times VD = VCC - 2V$$

When the charging voltage VC on the first path L4 is expressed as:

$$VC = (VCC - 4V) \text{ to } (VCC - 2V)$$

the voltage level of the charging voltage VC on the second path L5 is higher than that of the charging voltage VC on the first path L4, and therefore, the first diode Di1 is reverse-biased so that the second capacitor C is charged up from the first capacitor C1 only through the second path L5. As a result of this, the charging voltage VC becomes:

$$VC = (VCC - 2V) \text{ to } VCC \qquad \text{Eq.(2)}$$

It then follows that considering the equation (2) above, only if the voltage VCC in the low-voltage d.c. power source 4 is set just 1V higher than an optimal value (5V, for example) of the drive voltage to the high-voltage side switching device Q2 (i.e., only if VCC in the equation (2) above is replaced with VCC+1V), a variation in the voltage which is supplied to the high-voltage side drive circuit 2 is confined to±1V. In other words, if the voltage VCC in the low-voltage d.c. power source 4 is set at a value which is equal to a sum of the drive voltage (5V) to the high-voltage side switching device Q2 and the forward-direction voltage VD to the first diode Di1, a variation in the supplied voltage is suppressed to±1V.

A voltage is supplied to the low-voltage side drive circuit 3 on a path which reaches the Zener diode ZD1 from the low-voltage d.c. power source 4 through the resistor R1. In this case, the Zener diode ZD1 which is used has a Zener voltage which is equal to an optimal value (5V) of the drive voltage to the low-voltage side switching device Q1. Hence, if VCC=5V+1V is ensured, the value of the resistor R1 is set so that the voltage at the resistor R1 is 1V.

FIGS. 3(a) to 3(g) show timing charts of the operations described above.

The following can be said from the foregoing: A portion 10 which is formed by the elements C, C1, SW1, Di2 and SW2 is connected to the cathode of the diode Di1, the ground GND and the third terminal of the high-voltage side drive circuit 2, whereby forming a charging voltage supply circuit. When the high-voltage side switching device Q2 operates in the ON-state, the charging voltage supply circuit stores a charge which is supplied from the low-voltage d.c. power source 4 but not through the low-voltage side switching device Q1 nor the low-voltage side diode D1 and which is needed to drive the high-voltage side switching device Q2. When the low-voltage side switching device Q1 operates in the ON-state, the charging voltage supply circuit supplies a charging voltage which is in accordance with the charge described above to the high-voltage side drive circuit 2.

(B) Next, operations of the circuit which is shown in FIG. 2 in the second drive method will be described. The forward-direction voltages to the first diode Di1 and the second diode Di2 will be both denoted as VD, and the ON-voltages to the first switch SW1 and the second switch SW2 are both 0V.

(a) Where the low-voltage side switching device Q1 is ON:

The first switch SW1 is turned on and the second switch SW2 is turned off under control. At this stage, from the low-voltage d.c. power source 4, on the charging path L3 which is formed by the elements Di1, C1 and SW1, the first capacitor C1 is charged up. The charging voltage VC1 is expressed as:

$$VC1 = VCC - VD$$

Since the second switch SW2 is OFF, neither the low-voltage side switching device Q1 nor the low-voltage side diode D1 is in the charging path L3. This eliminates a cause of a variation in the charging voltage VC1.

At this time, the voltage VC which has been already charged up in the second capacitor C operates the high-voltage side drive circuit 2. However, since the high-voltage side switching device Q2 is OFF, a potential at the output terminal OUT(i.e., node N1) is low, so that the second capacitor C is charged up on a path which reaches the low-voltage side switching device Q1 or the low-voltage side diode D1 through the elements Di1, Di2 and C from the low-voltage d.c. power source 4. The charging voltage VC is expressed as:

$$VC=(VCC-2\times VD-VCE)\ to(VCC-2\times VD+VE)=(VCC-4V)\ to\ VCC$$

where VCE=VF=2V and VD=1V. Although the charging voltage VC is(VCC−4V) in the worst case, since the second switch SW2 is OFF, there is no problem at all.

(b) Where the high-voltage side switching device Q2 is ON:

The first switch SW1 is turned off and the second switch SW2 is turned on under control. At this stage, the second capacitor C is charged up on a path which reaches the elements Di2, C and SW2 from the first capacitor C1. Where VD=1V, the charging voltage VC is expressed as:

$$VC=VC1-VD=VCC-2\times VD=VCC-2V$$

Only when the charging voltage VC to the second capacitor C is in the range of:

$$VC=(VCC-4V)\ to(VCC-2V)$$

the first diode Di1 is reverse-biased so that the second capacitor C is charged up only on the second path L5 which reaches the elements Di2, C and SW2 from the first capacitor C1. As a result of this, the charging voltage VC becomes:

$$VC=(VCC-2V)\ to\ VCC \qquad \text{Eq.(3)}$$

Considering the equation(3) above, only if the voltage VCC in the low-voltage d.c. power source 4 is set just 1V higher than the optimal value (5V, for example) of the drive voltage to the high-voltage side switching device Q2(i.e., the forward-direction voltage VD to the first diode Di1 higher than the optimal value), a variation in the voltage which is supplied to the high-voltage side drive circuit 2 is confined to ±1V.

FIGS. 4(a) to 4(g) show timing charts of the operations described above.

It then follows that in the method(B), the portion 10 which is formed by the elements C, C1, SW1, Di2 and SW2 shown in FIG. 2 is connected to the cathode of the diode Di1, the ground GND and the third terminal of the high-voltage side drive circuit 2, whereby forming a charging voltage supply circuit. When the low-voltage side switching device Q1 operates in the ON-state, the charging voltage supply circuit stores a charge which is supplied from the low-voltage d.c. power source 4 but not through the low-voltage side switching device Q1 nor the low-voltage side diode D1 and which is needed to drive the high-voltage side switching device Q2. When the high-voltage side switching device Q2 operates in the ON-state, the charging voltage supply circuit supplies a charging voltage which is in accordance with the charge described above to the high-voltage side drive circuit 2.

As described earlier, in the method(A) above, the first capacitor C1 is charged up while the high-voltage side switching device Q2 is controlled to operate in the ON-state whereas the second capacitor C is charged up during the ON-state operations of the low-voltage side switching device Q1, and the resultant charging voltages are supplied to the circuit 2 during the next ON-state operations of the high-voltage side switching device Q2. On the other hand, in the method(B), the first capacitor C1 is charged up when the low-voltage side switching device Q1 is ON while the second capacitor C is charged up when the high-voltage side switching device Q2 is ON, so that the resultant charging voltages are supplied to the high-voltage side drive circuit 2.

Table 1 and Table 2 summarize the switching control in the methods(A) and (B).

TABLE 1

|  | Q2:ON(Q1:OFF) | Q1:ON(Q2:OFF) |
| --- | --- | --- |
| SW1 | ON | OFF |
| SW2 | OFF | ON |

TABLE 2

|  | Q1:ON(Q2:OFF) | Q2:ON(Q1:OFF) |
| --- | --- | --- |
| SW1 | ON | OFF |
| SW2 | OFF | ON |

Since it is necessary only to control so that the first switch SW1 is turned on or off when the low-voltage side switching device Q1 is ON, it is possible to use a signal which is outputted from the low-voltage side drive circuit 3 to turn on the low-voltage side switching device Q1 as a control signal to the first switch SW1. This allows easy control of turning on and off of the first switch SW1. Meanwhile, with respect to the second switch SW2, since it is necessary only to control so that the second switch SW2 is turned on or off when the high-voltage side switching device Q2 is ON, it is possible to use a signal which is outputted from the high-voltage side drive circuit 2 to turn on the high-voltage side switching device Q2 as a control signal to the second switch SW2, which makes it easy to control the second switch SW2 to turn on and off.

<Modification Of Second Preferred Embodiment>

Figure 5:
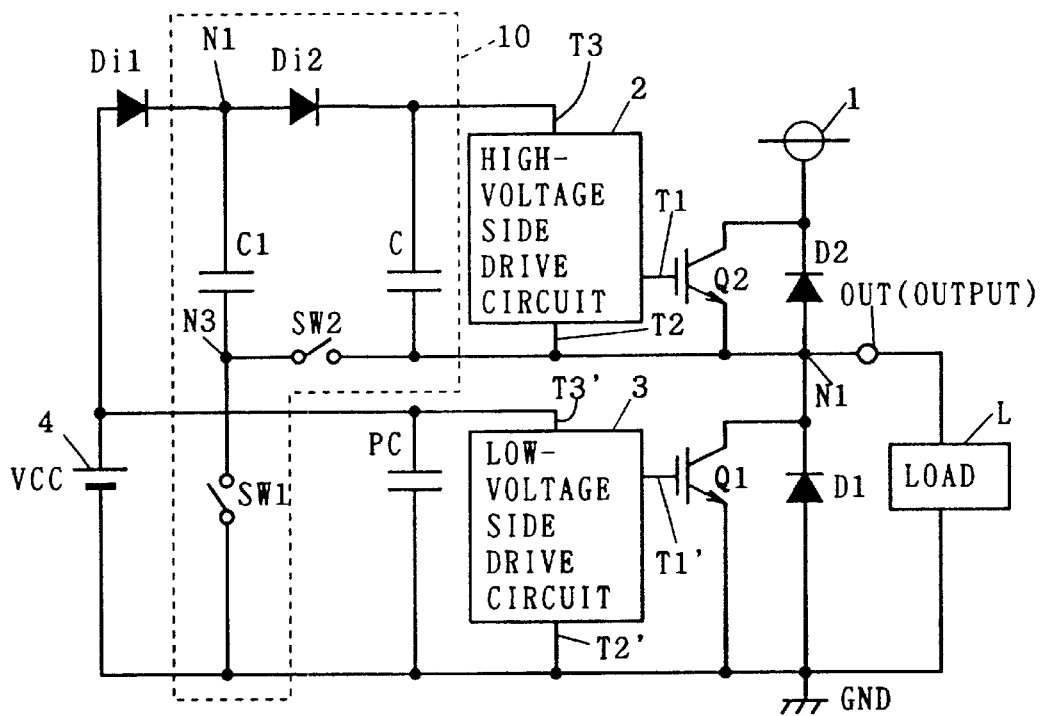
FIGS. 5 and 6 are diagrams showing a modification of the circuit which is shown in FIG. 2.

(1) FIG. 5 shows modification of the circuit which is shown in FIG. 2, and corresponds to FIG. 2 as it is modified to remove the first resistor R1. That is, in the circuit which is shown in FIG. 5, the low-voltage d.c. power source 4 supplies a voltage directly to the low-voltage side drive circuit 3. Although the supply voltage VCC from the power source 4 is just 1V higher than the optimal values (5V, for example) of the drive voltages to the high-voltage side switching device Q2 and the low-voltage side switching device Q1, this creates no actual problem. This structure simplifies the circuit structure.

Figure 6:
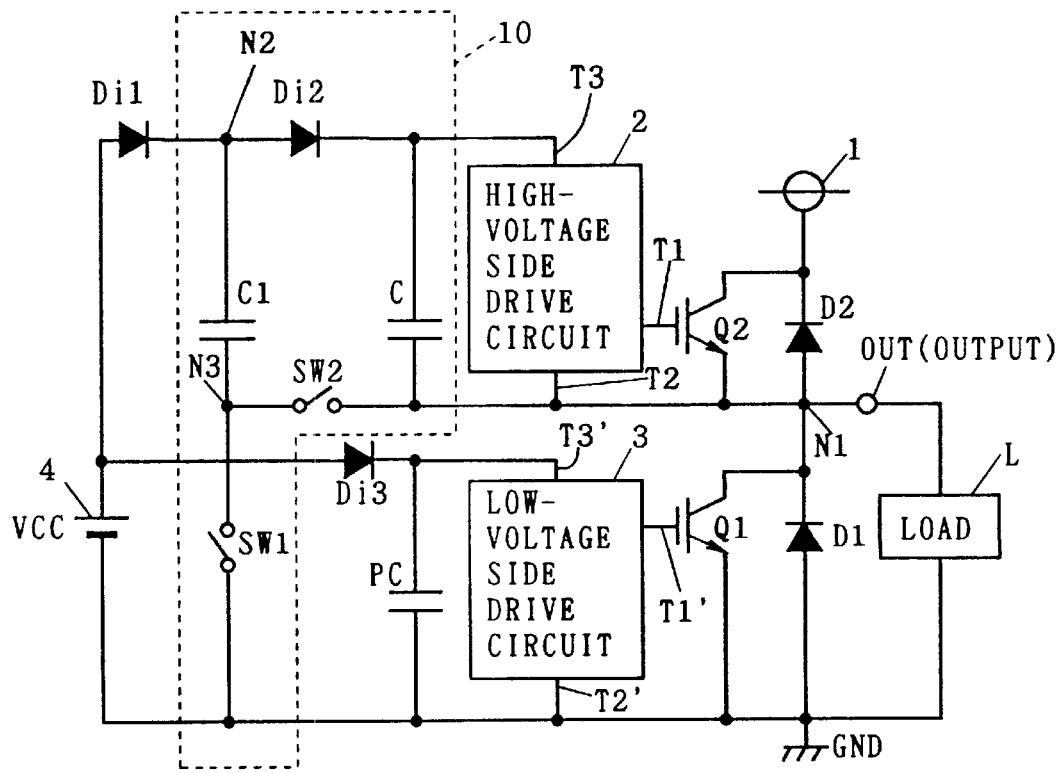

(2) A circuit which is shown in FIG. 6 is also modification of the circuit which is shown in FIG. 2, and corresponds to FIG. 2 as it is modified to replace the first resistor R1 with a third diode Di3. More particularly, the supply voltage VCC is supplied to the low-voltage side drive circuit 3 through the third diode Di3. Where a forward-direction voltage VD to the third diode Di3 is 1V, the supply voltage which is supplied to the low-voltage side drive circuit 3 is expressed as:

$$VCC-VD=VCC-1V$$

Thus, it is possible to supply the optimal values (5V, for example) of the drive voltages to the high-voltage side switching device Q2 and the low-voltage side switching device Q1 to the low-voltage side drive circuit 3.

(3) In the respective circuits according to the first preferred embodiment shown in FIGS. 2, 5 and 6, the first switch SW1 and the second switch SW2 can be formed using MOSFETs. In such a case, in FIGS. 2, 5 and 6, a portion other than the first and the second capacitors C1 and C, the low-voltage d.c. power source 4 and the load L can be made into a monolithic IC. More precisely, if the first switch SW1 and the second switch SW2 are formed by Nch-MOSFETs, it is possible to drive the Nch-MOSFETs of the first switch SW1 with the voltage VCC of the low-voltage d.c. power source 4 or the supply voltage to the low-voltage side drive circuit 3, and to drive the Nch-MOSFETs of the second switch SW2 with the supply voltage to the second capacitor C.

<Third Preferred Embodiment>

Figure 7:
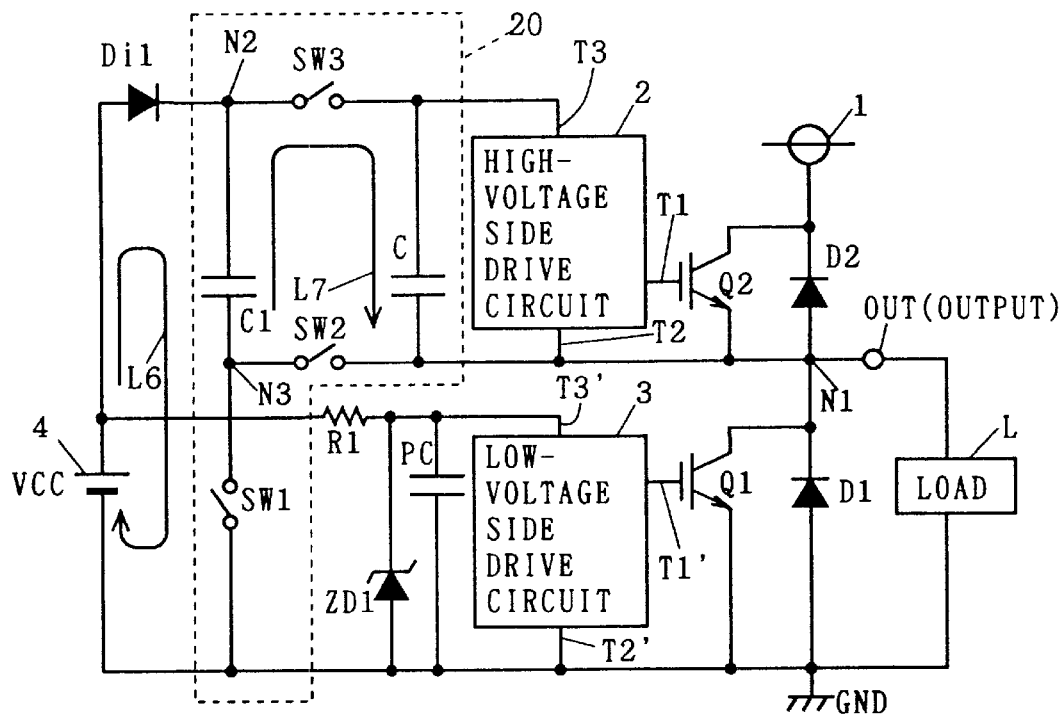
FIG. 7 is a diagram showing a single power source drive circuit for a power device of a half-bridge structure according to a third preferred embodiment of the present invention.

FIG. 7 is a diagram showing a structure of a semiconductor device according to a third preferred embodiment of the present invention. The device shown in FIG. 7 is different from the device shown in FIG. 2 in that the second diode Di2 of FIG. 2 is replaced with a third switch SW3. The structure is otherwise the same as that shown in FIG. 2.

Now, operations of this circuit will be described. The forward-direction voltage to the first diode Di1 will be denoted as VD, and the ON-voltages to the first switch SW1, the second switch SW2 and the third switch SW3 are all 0V.

(a) Where the low-voltage side switching device Q1 is ON:

The first switch SW1 is turned on and the second and the third switches SW2 and SW3 are turned off under control. At this stage, on a charging path L6 which reaches the elements Di1, C1 and SW1 from the low-voltage d.c. power source 4, the first capacitor C1 is charged up. The charging voltage VC1 is expressed as:

$$VC1 = VCC - VD = VCC - 1V$$

Since the second and the third switches SW2 and SW3 are OFF, neither the low-voltage side switching device Q1 nor the low-voltage side diode D1 is in the charging path L6.

At this time, the voltage VC which has been already charged up in the second capacitor C operates the high-voltage side drive circuit 2. However, since the high-voltage side switching device Q2 is OFF, although a potential at the output terminal OUT(i.e., node N1) is low, as both the second and the third switches SW2 and SW3 are OFF, the high-voltage side switching device Q2 remains OFF.

(b) Where the high-voltage side switching device Q2 is ON:

The first switch SW1 is turned off and the second and the third switches SW2 and SW3 are turned on under control. The diode Di1 is reverse-biased. At this stage, as a charging path, there is only a path L7 which reaches the elements SW3, C and SW2 from the first capacitor C1. The charging voltage VC is expressed as:

$$VC = VCC1 = VCC - VD = VCC - 1V$$

where VD=1V. The charging voltage VC for the second capacitor C causes the high-voltage side drive circuit 2 to operate, whereby the high-voltage side switching device Q2 is turned on.

Hence, only if the voltage VCC in the low-voltage d.c. power source 4 is set just 1V higher than the optimal values (5V, for example) of the drive voltages to the high-voltage side and low-voltage side switching devices Q2 and Q1 (i.e., the forward-direction voltage VD to the diode Di1 higher than the optimal values), the supply voltage to the high-voltage side drive circuit 2 is fixed to the optimal values. In this sense, a portion which is formed by the elements C1, SW1, SW2 and SW3 can be regarded as a function part which charges up the second capacitor C when the high-voltage side switching device Q2 is ON while fixing the supply voltage to the second capacitor C at a constant value.

Further, the following can be said from the foregoing: A portion 20 which is formed by the elements C, C1, SW1, SW2 and SW3 is connected to the cathode of the diode Di1, the ground GND and the third terminal of the high-voltage side drive circuit 2, whereby forming a charging voltage supply circuit. When the low-voltage side switching device Q1 operates in the ON-state, the charging voltage supply circuit stores a charge which is supplied from the low-voltage d.c. power source 4 but not through the low-voltage side switching device Q1 nor the low-voltage side diode D1 and which is needed to drive the high-voltage side switching device Q2. When the high-voltage side switching device Q2 operates in the ON-state, the charging voltage supply circuit supplies a charging voltage which is in accordance with the charge described above to the high-voltage side drive circuit 2.

This switching method is summarized in Table 3.

TABLE 3

|  | Q1:ON(Q2:OFF) | Q2:ON(Q1:OFF) |
| --- | --- | --- |
| SW1 | ON | OFF |
| SW2 | OFF | ON |
| SW3 | OFF | ON |
|  | C1 charged up | C charged up |

A voltage is supplied to the low-voltage side drive circuit 3 on a path which arrives at the Zener diode ZD1 from the low-voltage d.c. power source 4 through the resistor R1. The Zener voltage VZD1 which is equal to the optimal values (5V, for example) of the drive voltages to the two switching devices Q1 and Q2 is supplied to the circuit 3.

Meanwhile, with respect to the first switch SW1, since it is necessary only to control so that the first switch SW1 is turned on when the low-voltage side switching device Q1 is ON, it is possible to control turning on and off of the first switch SW1 in an easy manner by means of an ON-signal for the low-voltage side switching device Q1 which is outputted by the low-voltage side drive circuit 3.

With respect to the second and the third switches SW2 and SW3, since it is necessary only to control so that the second and the third switches SW2 and SW3 are both turn on when the high-voltage side switching device Q2 is ON, it is possible to control the second and the third switches SW2 and SW3 to turn on and off in an easy manner by means of the signal for turning on the high-voltage side switching device Q2 which is outputted by the high-voltage side drive circuit 2.

<Modification Of Third Preferred Embodiment>

Figure 8:
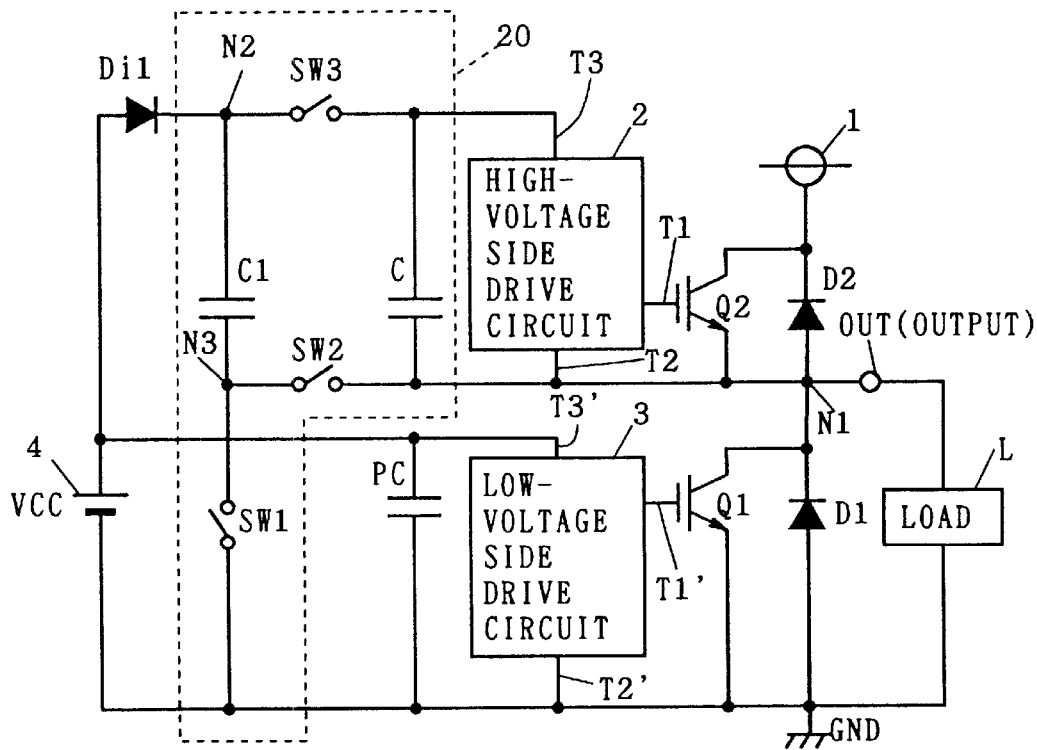
FIGS. 8 and 9 are diagrams showing a modification of the circuit which is shown in FIG. 7.

(1) A circuit shown in FIG. 8 is obtained by modifying the circuit shown in FIG. 7 in the same manner as that for modifying the circuit shown in FIG. 2 into the circuit shown in FIG. 5. Therefore, the circuit shown in FIG. 7 as well is capable of exhibiting advantages which are unique to the circuit shown in FIG. 5. This allows the structure shown in FIG. 8 to simplify the circuit structure.

Figure 9:
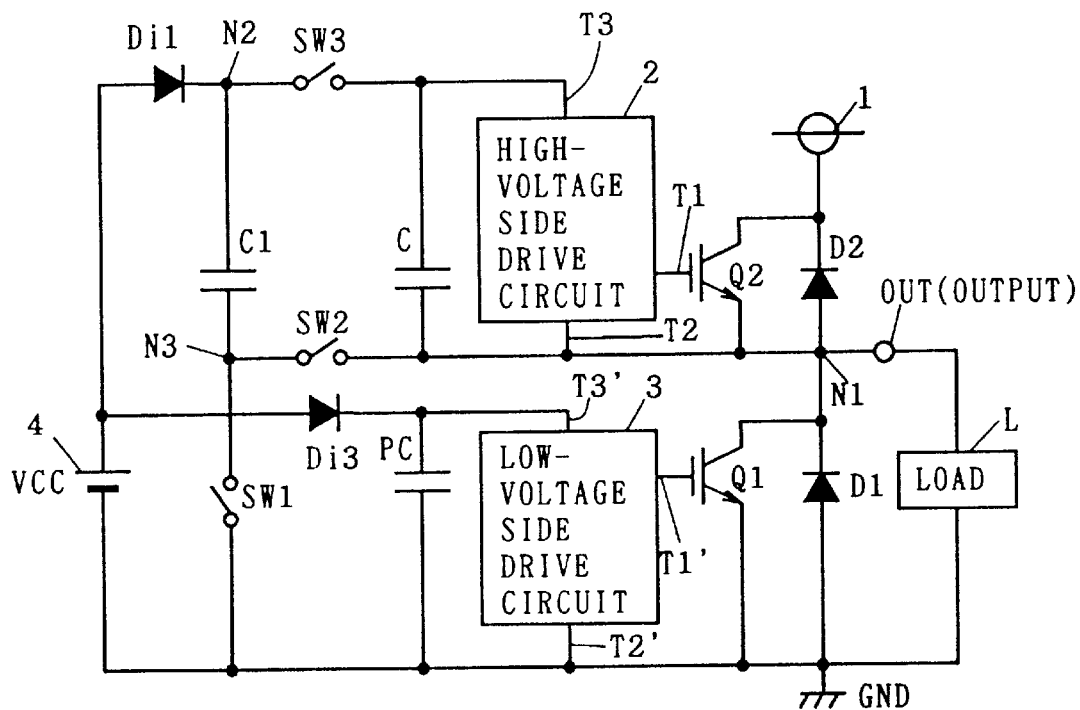
Figure 10:
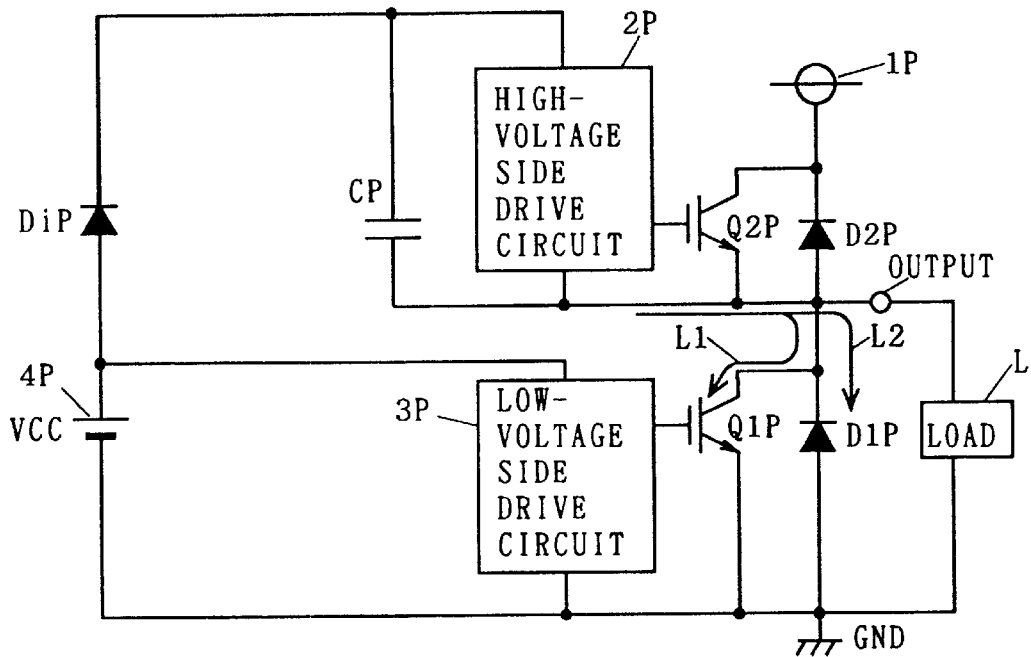
FIG. 10 is a diagram showing a conventional single power source drive circuit for a power device of a half-bridge structure.

(2) A circuit shown in FIG. 9 is equivalent to the circuit shown in FIG. 7 as it is modified in the same manner in which the circuit shown in FIG. 2 is modified into the circuit shown in FIG. 6. Hence, where the forward-direction voltage to the diode Di3 is VD, the supply voltage to the low-voltage side drive circuit 3 is:

$$VCC - VD = VCC - 1V$$

Thus, with only one diode, it is possible to supply the optimal values (5V, for example) of the drive voltages to the two switching devices Q1 and Q2.

(3) In the respective circuits shown in FIGS. 7, 8 and 9, the first, the second and the third switches SW1, SW2 and SW3 can be formed using MOSFETs, and a portion other than the first and the second capacitors C1 and C, the low-voltage d.c. power source 4 and the load L can be formed into a monolithic IC.

More precisely, if the first switch SW1 and the second switch SW2 are formed by Nch-MOSFETs and the third switch SW3 is formed by Pch-MOSFETs, it is possible to drive the Nch-MOSFETs of the first switch SW1 with the voltage VCC of the low-voltage d.c. power source 4 or the supply voltage to the low-voltage side drive circuit 3, and to drive the Nch-MOSFETs and the Pch-MOSFETs of the second and the third switches SW2 and SW3 with the supply voltage to the second capacitor C.

<Review>

As described above, charging up of the capacitor C which serves as a power source for the high-voltage side drive circuit 2 does not require the path in which the low-voltage side switching device Q1 or the low-voltage side diode D1 exists according to the second and the third preferred embodiments of the present invention, whereas the charging voltage is fixed at the Zener voltage according to the first preferred embodiment. Hence, a variation in the charging voltage to the capacitor C is 0V in the first preferred embodiment which is shown in FIG. 1, within ±1V in the second preferred embodiment which is shown in FIGS. 2, 5 and 6, and 0V in the third preferred embodiment which is shown in FIGS. 7, 8 and 9. Thus, it is possible to realize a single power source drive circuits for a power device of a half-bridge structure, in which a variation in the charging voltage to the capacitor C is small or there is no variation in the charging voltage to the capacitor C. Therefore, when the voltage in the low-voltage d.c. power source is set at a predetermined value in each one of the first, the second and the third preferred embodiments, it is possible to realize a single power source drive circuit for a power device of a half-bridge structure, with which a 5V-driven switching device can be used at a low-voltage d.c. power source voltage of 5V.

While the invention has been described in detail, the foregoing description is in all aspects illustrative and not restrictive. It is understood that numerous other modifications and variations can be devised without departing from the scope of the invention.

I claim:

1. A semiconductor device, comprising:
   a high-voltage direct current power source;
   a high-voltage side switching device whose first electrode is connected to said high-voltage direct current power source;
   a high-voltage side drive circuit whose first terminal and second terminal are respectively connected to a control electrode and a second electrode of said high-voltage side switching device;
   a low-voltage side switching device whose first electrode is connected to said second electrode of said high-voltage side switching device, a second electrode of said low-voltage side switching device being connected to a ground; and
   a low-voltage side drive circuit whose first terminal and second terminal are respectively connected to a control electrode and said second electrode of said low-voltage side switching device,
   wherein said high-voltage side switching device and said low-voltage side switching device are controlled by said high-voltage side drive circuit and said low-voltage side drive circuit to alternatively turn on and off, and
   said semiconductor device further comprises:
   a diode;
   a low-voltage direct current power source whose one end and other end are respectively connected to an anode of said diode and said ground;
   a capacitor whose first electrode is connected to said one end of said low-voltage direct current power source through said diode and also to a third terminal of said high-voltage side drive circuit, a second electrode of said capacitor being connected to said second electrode of said high-voltage side switching device; and
   a voltage fixing circuit connected in parallel to said capacitor for fixing a voltage value between the both ends of said capacitor during charging of said capacitor which occurs while said high-voltage side switching device operates in an on-state.

2. The semiconductor device of claim 1, further comprising:
   a low-voltage side diode whose cathode and anode are respectively connected to said first electrode and said second electrode of said low-voltage side switching device; and
   a resistor whose one end and other end are respectively connected to a cathode of said diode and said first electrode of said capacitor,
   wherein said voltage fixing circuit comprises a Zener diode whose cathode is connected to said first electrode of said capacitor and whose anode is connected to said second electrode of said capacitor, and
   a voltage in said low-voltage direct current power source is set at a larger value than a sum of a Zener voltage of said Zener diode, a forward-direction voltage to said diode and an ON-voltage to said low-voltage side switching device.

3. The semiconductor device of claim 2, further comprising:
   another Zener diode whose cathode and anode are respectively connected to a third terminal of said low-voltage side drive circuit and said ground; and
   another resistor which is connected between said one end of said low-voltage direct current power source and said cathode of said another Zener diode.

4. A semiconductor device, comprising:
   a high-voltage side switching device whose first electrode is connected to a high-voltage direct current power source;
   a high-voltage side drive circuit whose first terminal and second terminal are respectively connected to a control electrode and a second electrode of said high-voltage side switching device;
   a low-voltage side switching device whose first electrode is connected to said second electrode of said high-voltage side switching device, a second electrode of said low-voltage side switching device being connected to a ground; and
   a low-voltage side drive circuit whose first terminal and second terminal are respectively connected to a control electrode and said second electrode of said low-voltage side switching device,
   wherein said high-voltage side switching device and said low-voltage side switching device are controlled by said high-voltage side drive circuit and said low-voltage side drive circuit to alternatively turn on and off, and said semiconductor device further comprises:
a low-voltage side diode whose cathode and anode are respectively connected to said first electrode and said second electrode of said low-voltage side switching device;
a diode;
a low-voltage direct current power source whose one end and other end are respectively connected to an anode of said diode and said ground; and
a charging voltage supplying circuit which is connected to a cathode of said diode, said ground and a third terminal of said high-voltage side drive circuit, said charging voltage supplying circuit storing a charge which is supplied from said low-voltage direct current power source but not through said low-voltage side switching device nor said low-voltage side diode and which is needed to drive said high-voltage side switching device when said low-voltage side switching device operates in an on-state, said charging voltage supplying circuit supply ing a charging voltage which is in accordance with said charge to said high-voltage side drive circuit when said high-voltage side switching device operates in an on-state.

5. The semiconductor device of claim 4,
wherein when said diode is regarded as a first diode, and said charging voltage supplying circuit comprises:
a first capacitor whose first electrode is connected to said cathode of said first diode;
a first switch which is disposed between a second electrode of said first capacitor and said ground, said first switch being controlled to turn on when said low-voltage side switching device operates in an on-state, said first switch being controlled to turn off when said high-voltage side switching device operates in an on-state;
a second diode whose anode and cathode are respectively connected to said cathode of said first diode and said third terminal of said high-voltage side drive circuit;
a second capacitor whose first and second electrodes are respectively connected to said third and said second terminals of said high-voltage side drive circuit; and
a second switch which is disposed between said second electrode of said first capacitor and said second electrode of said second capacitor, said second switch being controlled to turn off when said low-voltage side switching device operates in an on-state, said second switch being controlled to turn on when said high-voltage side switching device operates in an on-state.

6. The semiconductor device of claim 4,
wherein said charging voltage supplying circuit comprises:
a first capacitor whose first electrode is connected to said cathode of said diode;
a first switch which is disposed between a second electrode of said first capacitor and said ground, said first switch being controlled to turn on when said low-voltage side switching device operates in an on-state, said first switch being controlled to turn off when said high-voltage side switching device operates in an on-state;
a second capacitor whose first and second electrodes are respectively connected to said third and said second terminals of said high-voltage side drive circuit;

a second switch which is disposed between said second electrode of said first capacitor and said second electrode of said second capacitor, said second switch being controlled to turn off when said low-voltage side switching device operates in an on-state, said second switch being controlled to turn on when said high-voltage side switching device operates in an on-state; and
a third switch which is disposed between said first electrode of said first capacitor and said first electrode of said second capacitor, said third switch being controlled to turn off when said low-voltage side switching device operates in an on-state, said third switch being controlled to turn on when said high-voltage side switching device operates in an on-state.

7. The semiconductor device of claim 5, further comprising:
another Zener diode whose cathode and anode are respectively connected to a third terminal of said low-voltage side drive circuit and said ground; and
another resistor which is connected between said one end of said low-voltage direct current power source and said cathode of said another Zener diode.

8. The semiconductor device of claim 5, further comprising:
a third diode which is connected between a third terminal of said low-voltage side drive circuit and said one end of said low-voltage direct current power source.

9. The semiconductor device of claim 5,
wherein a third terminal of said low-voltage side drive circuit is connected directly to said one end of said low-voltage direct current power source.

10. The semiconductor device of claim 6, further comprising:
another Zener diode whose cathode and anode are respectively connected to a third terminal of said low-voltage side drive circuit and said ground; and
another resistor which is connected between said one end of said low-voltage direct current power source and said cathode of said another Zener diode.

11. The semiconductor device of claim 6, further comprising:
a third diode which is connected between a third terminal of said low-voltage side drive circuit and said one end of said low-voltage direct current power source.

12. The semiconductor device of claim 6,
wherein a third terminal of said low-voltage side drive circuit is connected directly to said one end of said low-voltage direct current power source.

13. The semiconductor device of claim 5, wherein a voltage in said low-voltage direct current power source is set at a value which is obtained by adding a forward-direction voltage to said first diode to a drive voltage to said high-voltage side switching device.

14. The semiconductor device of claim 6,
wherein a voltage in said low-voltage direct current power source is set at a value which is obtained by adding a forward-direction voltage to said first diode to a drive voltage to said high-voltage side switching device.

15. A semiconductor device, comprising:
a high-voltage side switching device whose first electrode is connected to a high-voltage direct current power source;
a high-voltage side drive circuit whose first terminal and second terminal are respectively connected to a control electrode and a second electrode of said high-voltage side switching device;

a low-voltage side switching device whose first electrode is connected to said second electrode of said high-voltage side switching device, a second electrode of said low-voltage side switching device being connected to a ground; and a low-voltage side drive circuit whose first terminal and second terminal are respectively connected to a control electrode and said second electrode of said low-voltage side switching device, wherein said high-voltage side switching device and said low-voltage side switching device are controlled by said high-voltage side drive circuit and said low-voltage side drive circuit to alternatively turn on and off, and said semiconductor device further comprises:

a low-voltage side diode whose cathode and anode are respectively connected to said first electrode and said second electrode of said low-voltage side switching device;

a diode;

a low-voltage direct current power source whose one end and other end are respectively connected to an anode of said diode and said ground; and a charging voltage supplying circuit which is connected to a cathode of said diode, said ground and a third terminal of said high-voltage side drive circuit, said charging voltage supplying circuit storing a charge which is supplied from said low-voltage direct current power source but not through said low-voltage side switching device nor said low-voltage side diode and which is needed to drive said high-voltage side switching device when said high-voltage side switching device operates in an on-state, said charging voltage supplying circuit supplying a charging voltage which is in accordance with said charge to said high-voltage side drive circuit when said low-voltage side switching device operates in an on-state.

16. The semiconductor device of claim 15, wherein when said diode is regarded as a first diode, and said charging voltage supplying means comprises:

a first capacitor whose first electrode is connected to said cathode of said first diode;

a first switch which is disposed between a second electrode of said first capacitor and said ground, said first switch being controlled to turn on when said high-voltage side switching device operates in an on-state, said first switch being controlled to turn off when said low-voltage side switching device operates in an on-state;

a second diode whose anode and cathode are respectively connected to said cathode of said first diode and said third terminal of said high-voltage side drive circuit;

a second capacitor whose first and second electrodes are respectively connected to said third and said second terminals of said high-voltage side drive circuit; and a second switch which is disposed between said second electrode of said first capacitor and said second electrode of said second capacitor, said second switch being controlled to turn off when said high-voltage side switching device operates in an on-state, said second switch being controlled to turn on when said low-voltage side switching device operates in an on-state.

17. The semiconductor device of claim 16, wherein a voltage in said low-voltage direct current power source is set at a value which is obtained by adding a forward-direction voltage to said first diode to a drive voltage to said high-voltage side switching device.

18. The semiconductor device of claim 16, further comprising:

another Zener diode whose cathode and anode are respectively connected to a third terminal of said low-voltage side drive circuit and said ground; and another resistor which is connected between said one end of said low-voltage direct current power source and said cathode of said another Zener diode.

19. The semiconductor device of claim 16, further comprising:

a third diode which is connected between a third terminal of said low-voltage side drive circuit and said one end of said low-voltage direct current power source.

20. The semiconductor device of claim 16, wherein a third terminal of said low-voltage side drive circuit is connected directly to said one end of said low-voltage direct current power source.

* * * * *